(12) United States Patent
Wirz et al.

(10) Patent No.: US 11,908,828 B2
(45) Date of Patent: Feb. 20, 2024

(54) CONTAMINANT CONTROL IN THERMOCOMPRESSION BONDING OF SEMICONDUCTORS AND ASSOCIATED SYSTEMS AND METHODS

(71) Applicant: Micron Technology, Inc., Boise, ID (US)

(72) Inventors: Brandon P. Wirz, Boise, ID (US); Jaekyu Song, Boise, ID (US); Sui Chi Huang, Taichung (TW)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/845,635

(22) Filed: Jun. 21, 2022

(65) Prior Publication Data

US 2022/0320037 A1    Oct. 6, 2022

Related U.S. Application Data

(62) Division of application No. 16/693,192, filed on Nov. 22, 2019, now Pat. No. 11,410,964.

(51) Int. Cl.
*H01L 21/67* (2006.01)
*H01L 21/50* (2006.01)
(Continued)

(52) U.S. Cl.
CPC ............. *H01L 24/80* (2013.01); *H01L 21/50* (2013.01); *H01L 21/67098* (2013.01);
(Continued)

(58) Field of Classification Search
CPC .................. H01L 21/67144; H01L 2224/8309
See application file for complete search history.

(56) References Cited

U.S. PATENT DOCUMENTS 5,757,068 A * 5/1998 Kata .................. H01L 23/49572
257/676
5,817,545 A * 10/1998 Wang .................. B29C 33/0044
438/126

(Continued)

FOREIGN PATENT DOCUMENTS

CN    112838026 A  *  5/2021  ............. H01L 21/50
CN    112838026 A      5/2021
(Continued)

OTHER PUBLICATIONS

TW Patent Application No. 109138552—Taiwanese Office Action and Search Report, dated Jul. 28, 2021, with English Translation, 14 pages.

*Primary Examiner* — Edward Chin
(74) *Attorney, Agent, or Firm* — Perkins Coie LLP (57) ABSTRACT

Systems and methods for controlling contamination during thermocompression bonding are provided herein. The tool generally includes a bondhead having a first channel extending in a lateral direction from a first port along a second side toward a perimeter of the bondhead. In several examples, the bondhead includes a second channel fluidly coupled to a second port and extending in a lateral direction along an inset surface of the bondhead, where the second channel at least partially surrounds the first channel. In other examples, the tool includes a vacuum manifold having a vacuum opening positioned laterally outward from the bondhead. A first flow unit is coupled to the first channel and is configured to withdraw air. A second flow unit is coupled to the second port or the manifold to withdraw fluid and prevent outgassing bonding materials from entering the first channel, depositing on the bondhead, and/or contaminating neighboring semiconductor components.

6 Claims, 4 Drawing Sheets

(51) Int. Cl.
*H01L 21/60* (2006.01)
*H01L 23/00* (2006.01)

(52) U.S. Cl.
CPC ............. *H01L 2021/60195* (2013.01); *H01L 2224/75251* (2013.01); *H01L 2224/81203* (2013.01); *H01L 2224/94* (2013.01)

(56) References Cited

U.S. PATENT DOCUMENTS

| | | | | |
|---|---|---|---|---|
| 6,160,309 | A * | 12/2000 | Le | H01L 23/051 |
| | | | | 257/E23.187 |
| 6,187,613 | B1 * | 2/2001 | Wu | H01L 24/28 |
| | | | | 438/126 |
| 6,309,915 | B1 * | 10/2001 | Distefano | H01L 24/01 |
| | | | | 438/126 |
| 6,703,299 | B2 * | 3/2004 | Shi | H01L 24/29 |
| | | | | 257/E21.503 |
| 2011/0020983 | A1 * | 1/2011 | Tomura | H01L 21/563 |
| | | | | 428/305.5 |
| 2011/0035936 | A1 * | 2/2011 | Lee | H01L 24/75 |
| | | | | 29/740 |
| 2011/0132449 | A1 * | 6/2011 | Ramadas | B82Y 30/00 |
| | | | | 428/419 |
| 2012/0043005 | A1 | 2/2012 | Yamakami et al. | |
| 2013/0175324 | A1 | 7/2013 | Chang et al. | |
| 2017/0207288 | A1 * | 7/2017 | Kang | H10K 59/131 |
| 2017/0250157 | A1 * | 8/2017 | Kim | H01L 21/2636 |
| 2018/0012815 | A1 * | 1/2018 | Li | H01L 24/83 |
| 2019/0067238 | A1 * | 2/2019 | McClain | H01L 24/75 |
| 2020/0058528 | A1 * | 2/2020 | Nagai | H01L 21/6838 |
| 2020/0388522 | A1 * | 12/2020 | Ahn | B23K 37/047 |
| 2021/0159206 | A1 | 5/2021 | Wirz et al. | |
| 2021/0225799 | A1 | 7/2021 | Seyama et al. | |
| 2021/0288021 | A1 * | 9/2021 | Oka | H01L 24/75 |

FOREIGN PATENT DOCUMENTS

| | | | |
|---|---|---|---|
| TW | 201209967 A | 3/2012 | |
| TW | 201328807 A | 7/2013 | |
| TW | 201739025 A | 11/2017 | |
| WO | 2006129520 A1 | 12/2006 | |
| WO | WO-2006129520 A1 * | 12/2006 | ............ B29C 43/18 |

* cited by examiner

CONTAMINANT CONTROL IN THERMOCOMPRESSION BONDING OF SEMICONDUCTORS AND ASSOCIATED SYSTEMS AND METHODS

CROSS-REFERENCE TO RELATED APPLICATION(S)

This application is a division of U.S. patent application Ser. No. 16/693,192, filed Nov. 22, 2019; which is incorporated herein by reference in its entirety.

TECHNICAL FIELD

The present disclosure is generally directed to bonded semiconductor devices, and in several embodiments, more particularly to systems and methods for controlling contamination from bond material outgassing during thermocompression bonding of semiconductor dies.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these demands, semiconductor die manufacturers often stack multiple semiconductor dies vertically on top of each other to increase the capacity or performance of a microelectronic device within the limited volume on the circuit board or other element to which the semiconductor dies are mounted. The stacks may be bonded together using a bonding material. For such vertically stacked semiconductor dies, through-silicon vias (TSV) are often used. These TSVs on adjacent semiconductor dies are typically electrically connected to each other using direct physical coupling in which the bond pads of one die are directly bonded to the bond pads of the other.

In a conventional semiconductor thermocompression bonding (TCB) process, a chip mounting apparatus picks up a semiconductor device through a bondhead by drawing a vacuum. The apparatus then transfers the semiconductor device to a bonding area where the semiconductor device is bonded to a substrate or another semiconductor device. The bonding process is typically performed at high temperatures to ensure the bonding material (e.g., a non-conductive film (NCF), a non-conductive paste (NCP), etc.) has an appropriate viscosity and interconnects are reliably formed; however, the bonding material can vaporize at the higher temperatures. In a conventional process, if temperature levels causing vaporization of the bonding material are reached, the vapor can enter and condense within the vacuum lines of the bondhead, leading to clogs and decreasing the strength of the vacuum over time. Further, since gaps often exist between the bondhead and the interfacing semiconductor die surface (e.g., due to imperfections and/or warpage in the topography of the die surface, or underbump metal), vapor can travel laterally and deposit contaminants on areas of the bond tip larger than the surface area of the die, or to adjacent semiconductor die stacks and other components of the device, causing contamination. Such contamination of the bondhead can cause the bondhead to stick to a semiconductor die during subsequent bonding operations. To reduce this form of contamination in conventional bonding operations, film assist bonding (FAB) tape is typically used.

DETAILED DESCRIPTION

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate or to a singulated, die-level substrate, or another die for die-stacking applications. A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The term "bondhead" can refer to an upper/lower chuck or a tool for use in mounting semiconductor dies to substrates. A person skilled in the relevant art will also understand that the technology may have additional embodiments and that the technology may be practiced without several of the details of the embodiments described below with reference to FIGS. 1A-3. A person having ordinary skill in the relevant art will recognize that suitable steps of the methods described herein can be performed at the wafer-level or at the die-level. Furthermore, unless the context indicates otherwise, structures disclosed herein can be formed using conventional semiconductor-manufacturing techniques.

The description and illustration of the shapes and configurations of the supplemental vacuum herein are exemplary, and should not be construed as limiting the scope of the present disclosure. In this regard, in several embodiments, the shape of the supplemental vacuum pattern is any shape suitable to create sufficient vacuum at the locations where the vaporized contaminants are created. Likewise, in other embodiments, the supplemental vacuum may be applied to the TCB process without the use of a recessed ledge or separated vacuum manifold.

In several embodiments, a semiconductor die includes at least one contact (e.g., bond pads or portions of TSVs that extend through the die) exposed at a surface. In these embodiments, an interconnect structure is electrically coupled by bonding to the contact to allow an electrical connection to be formed with other components of the semiconductor device. To form such a bond, a chip mounting apparatus picks up a semiconductor device through a bondhead by drawing a vacuum. The apparatus then transfers the semiconductor device to a bonding area where the semiconductor device is bonded to a substrate or another semiconductor device. Embodiments of the present technology are suitable for any thermocompression bonding process, e.g., sequential bonding, collective bonding, gang bonding, etc.

Thermocompression bonding (TCB) of a semiconductor die stack generally includes holding a representative semiconductor die against a bondhead with a vacuum pulled through a vacuum line. The semiconductor die is then carried, under vacuum, to a position above a substrate for bonding. A bonding material is disposed between the semiconductor die and the substrate to create the connection. Heat is applied through the bondhead to melt and flow the bonding material, mechanically and electrically connecting the semiconductor die to the substrate. Since gaps may exist between the interfacing surfaces of the bondhead and the semiconductor die, vapor from overheating the bonding material may (a) enter and condense within the vacuum line during bonding, (b) travel upward and be deposited on and thus contaminate the exposed surfaces of the bondhead where the bondhead extends outside of the surface area of the semiconductor die, and/or (c) travel to adjacent semiconductor die stacks and other components of the device. Such vapors may also be deposited on other surfaces of the bondhead that do not physically contact the semiconductor die.

TCB processes are performed at high temperatures to ensure the bonding material reaches a desired internal temperature to reliably form the interconnects, and as more dies are assembled in high density die stacks (e.g., 4, 6, 8 or more dies in a stack) still higher temperatures are needed to create the interconnect bonds. In this regard, when bonding stacks of semiconductor dies, e.g., stacks with more than 4 dies, or when bonding a stack of semiconductor dies with a thicker top die to prevent fillet contamination, the higher temperatures required for bonding cause more vaporization (outgassing) of the bonding material.

Such contamination causes various problems in conventional semiconductor device bonding. In one example, the contamination can cover a stacking fiducial on a neighboring semiconductor die stack and lead to recognition issues during manufacturing of the semiconductor device and/or produce die misalignment. The contamination can also cause semiconductor die to stick to the bondhead and/or contaminate the semiconductor die itself. At a certain level of contamination, the bondhead must be replaced leading to manufacturing process downtime and increased costs. Among other issues, the contamination can affect the under-bump metal (UBM) pads on the backside of the semiconductor die, causing poor interconnect quality, such as non-wets, cold joints, open interconnects, defective, or high resistance interconnects. The contamination described above is particularly applicable to three-dimensional integration (3DI) TCB processes for memory semiconductor devices (HBM, COW, 3DI DDR5, etc.); however, any TCB process for semiconductor devices is susceptible to the contamination described herein.

Although a FAB tape may be used to reduce NCF/NCP contamination in a TCB operation, the TCB process capability is generally limited by using FAB tape. For example, many of the commercially available FAB tapes have a maximum temperature of about 300° C., which is too low for bonding die stacks with several dies. As such, the use of FAB tape limits the height of the semiconductor die stack that can be bonded using conventional methods. In a specific example, to form interconnects throughout a die stack with eight semiconductor dies, the heat required may cause local temperatures of about 400° C. due to the lost heat through the multiple layers and the FAB tape.

In embodiments of the present technology, a supplemental vacuum source is applied in addition to the semiconductor die retention vacuum of the bondhead. The supplemental vacuum is expected to reduce the contamination described above and provide other advantages. The supplemental vacuum, for example, is configured to draw in and retain the offgassing vapors which cause NCF/NCP contamination during the TCB process. In this regard, the supplemental vacuum can at least inhibit the vapor from coating the bondhead or adjacent components of the semiconductor device. In some embodiments, the supplemental vacuum is arranged in one or more locations around the perimeter of the bondhead in proximity to the interface between the bondhead and the semiconductor die such that the supplemental vacuum draws in the vapor during the TCB process. In these embodiments, the configuration of the supplemental vacuum is contiguous with the bondhead; however, in other embodiments, the supplemental vacuum may be drawn through a separate vacuum manifold from the bondhead, as will be described in greater detail below.

Among other advantages over conventional technology, the supplemental vacuum TCB process described herein can provide improved die placement accuracy as a result of clearer fiducial recognition; improved die stack reliability through reduction of solder non-wets, cold joints, open interconnects, defects, or higher resistance interconnects; extended equipment and bondhead life; lower cost; and higher process capability for gang bonding without the need for FAB tape. The configurations of the present technology may be described herein in reference to TSV and/or three-dimensional integration (3DI); however, the present technology also applies to other interconnect types, including flip chip bonding (FC), direct chip attachment (DCA), and D2S, among others. The description of the present technology in conjunction with a specific configuration should not be construed as limiting the applications of the present technology.

Figure 1A:
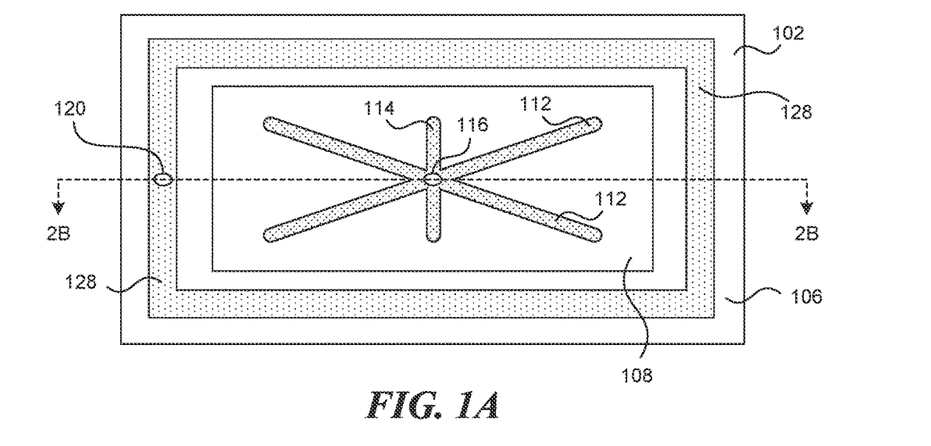
FIG. 1A is a bottom plan view of a bondhead configured in accordance with selected embodiments of the present technology.
Figure 1B:
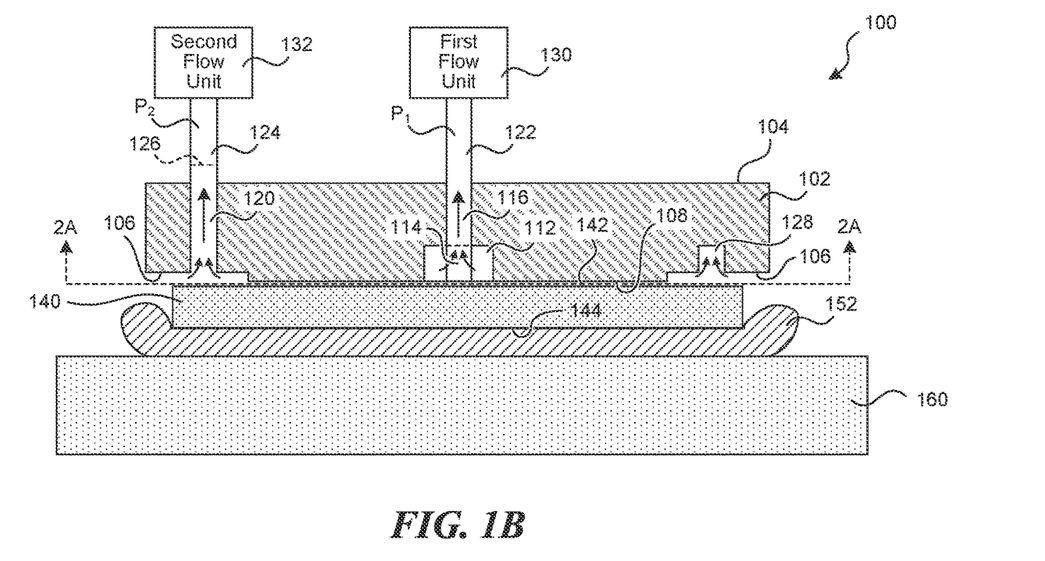
FIGS. 1B and 1C are a cross-sectional side views of a semiconductor processing tool including the bondhead shown in FIG. 1A.
Figure 1C:
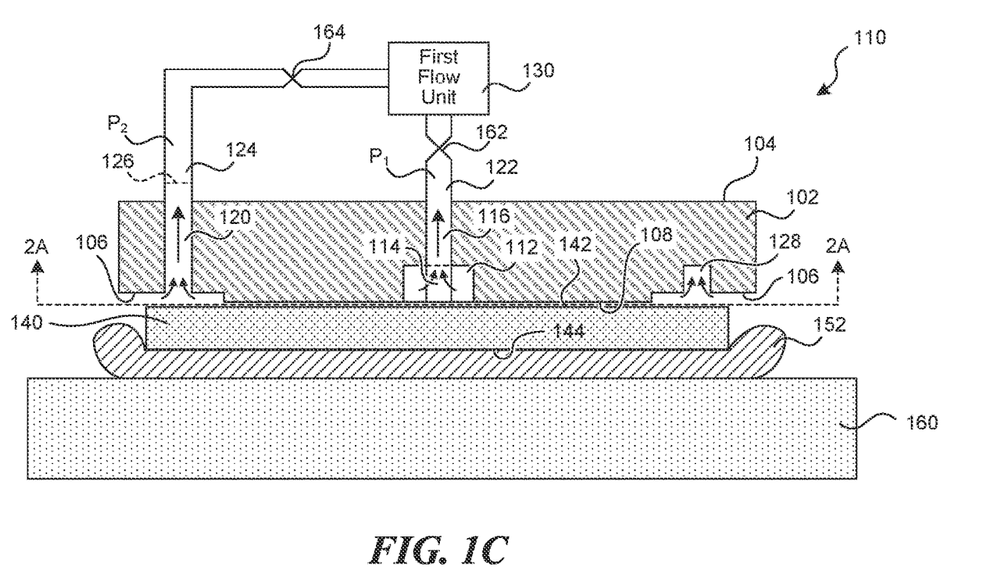

FIG. 1A is a bottom plan view of an embodiment of a bondhead 102 in accordance with embodiments of the present technology, and FIGS. 1B and 1C are cross-sectional side views of embodiments of semiconductor processing tools 100 ("tool 100") and 110 ("tool 110") that implement the bondhead 102. Referring first to FIG. 1B, the tool 100 includes a first vacuum conduit 122, a first flow unit 130 fluidly coupled to the first vacuum conduit 122, a second conduit 124, and a second flow unit 132 fluidly coupled to the second conduit 124. The first vacuum conduit 122 and the second conduit 124 are fluidically coupled to the bondhead 102. During a TCB process, the bondhead 102 is operably positioned over a semiconductor die 140 ("die 140") having a front side 142 and a back side 144 opposite the front side 142. During bonding in accordance with some embodiments, at least a portion of the front side 142 of the die 140 contacts the second side 108 of the bondhead 102, while the back side 144 of the die 140 is being bonded to a substrate 160 with a bonding material 152 (e.g., a non-conductive film (NCF), a non-conductive paste (NCP), or a wafer level underfill (WLUF) material, among others). A person of ordinary skill in the art will understand that in other embodiments the bondhead 102 can similarly be brought in contact with the back side 144 of the die 140 instead of the front side 142. The bonding material 152 can be applied at the wafer level and thus may be present on the die 140 at the bottom side 144 prior to the die 140 being picked up by the bondhead 102.

The bondhead 102 has a first side 104 and a second side 108 opposite the first side 104. As shown in FIGS. 1A, 1B, and 1C together, the bondhead 102 can include a first vacuum port 116, a first vacuum channel 112, and a second vacuum channel 114 fluidly coupled to the first vacuum port 116. Any number of first and second vacuum channels may be fluidly coupled to the first vacuum port 116, such as in the illustrated embodiment shown in FIG. 1A. The first and second vacuum channels 112 and 114 can be troughs or trenches arranged in a pattern across the second side 108 of the bondhead 102. The trough or trench profile allows the first and second vacuum channels 112 and 114 to form at least substantially closed channels when placed against or at least near an abutting surface of the die 140 during the TCB process. The illustrated embodiment in FIG. 1A depicts one arrangement of the first and second vacuum channels 112 and 114; however, the vacuum channels can be arranged in any suitable pattern to apply the vacuum across a die. For example, the first and second vacuum channels have any length, width, depth and number of channels to adequately apply the vacuum across the second side 108 and interface with the front side 142 or back side 144 to retain the die 140 during the TCB process. For example, the pattern of vacuum channels may be arranged to provide an adequate vacuum holding force for the specific type of semiconductor device being bonded by a TCB process, e.g., the weight of the device based on the number of dies in a stack, the thickness, size, etc.

As shown in FIGS. 1B and 1C, the first vacuum port 116 extends from the first side 104 of the bondhead 102 to a first intermediate depth of the bondhead 102, and the first and second vacuum channels 112 and 114 extend from the second side 108 of the bondhead 102 to the first intermediate depth to meet the first vacuum port 116 and form a fluid coupling. The first vacuum port 116 and the first and second vacuum channels 112 and 114 together comprise a first opening extending through the bondhead 102, which is fluidly coupled to the first flow unit 130 via the first vacuum conduit 122. In some embodiments, the first and second vacuum channels 112 and 114 may not have a uniform depth in the bondhead 102.

In some embodiments, during the TCB process, the first opening is generally centered over a centerpoint of the die 140; however, the first opening may be configured to retain the die 140 with a degree of misalignment, i.e., offset from the axis of the first vacuum port 116 and the centerpoint of the die 140. The first flow unit 130 is configured to draw a vacuum between the bondhead 102 and the die 140 by withdrawing a first fluid (e.g., air) at a first pressure ($P_1$) through the first vacuum port 116 and the first and second vacuum channels 112 and 114. The first pressure ($P_1$) can be less than about 0.1 megapascals (MPa), in the range of about 3 pascals (Pa) to about 0.1 MPa, or other suitable pressures.

The bondhead 102 can further include a ledge or step around the perimeter of the bondhead that is recessed from the surface that interfaces the die during the TCB process, such as a recessed ledge 106 extending a depth into the bondhead 102 from the second side 108 and arranged at least partially around a perimeter of the bondhead 102. In these embodiments, the recessed ledge or step provides clearance from the neighboring die stacks during bonding and reduces heat transfer to such neighboring die stacks. In this configuration, the vaporized contaminants are drawn in by the supplemental vacuum to avoid coating on the bondhead or neighboring components of the semiconductor. The recessed ledge 106, for example, can be inset from an edge of the bondhead 102 toward the axis of the first vacuum port 116. The recessed ledge 106 can be of any suitable depth from the second side 108 and any suitable inset from the edge toward the axis of the first vacuum port 116 to prevent interference with neighboring semiconductor die stacks during the TCB process. In the illustrated embodiment, the recessed ledge 106 is generally orthogonal and inset a uniform distance from each edge of the bondhead 102. The recessed ledge 106 can alternatively have surfaces with other shapes and can be inset from each edge any suitable distance or of any suitable profile, which may differ independently from each edge.

The bondhead 102 further includes a second vacuum port 120 and a second vacuum channel 128 fluidly coupled to the second vacuum port 120. The second vacuum channel 128 can be a trough or trench in the recessed ledge 106 of the bondhead 102 that extends at least partially around the perimeter of the bondhead 102. The second vacuum port 120 extends from the first side 104 of the bondhead 102 toward the recessed ledge 106 to a second intermediate depth, and the second vacuum channel 128 extends from the recessed ledge 106 of the bondhead 102 to the second intermediate depth to meet the second vacuum port 120. The second vacuum port 120 and the second vacuum channel 128 together comprise a second opening extending through the bondhead 102. The second vacuum channel 128 surrounds and the first and second vacuum channels 112 and 114 such that the second vacuum channel 128 is positioned outwardly from the first and second vacuum channels 112 and 114. In the illustrated embodiment, the second vacuum channel 128 has a square cross-sectional profile, but it can be other suitable shapes (e.g., V-shaped, arcuate, etc.) to distribute the vacuum around the die 140 and for drawing in the vapor from the TCB process.

In FIG. 1B, the tool 100 has a second opening fluidly coupled to the second flow unit 132 and is generally positioned over a peripheral portion of the die 140 along the recessed ledge 106. The second flow unit 132 is configured to withdraw the second fluid from the second vacuum channel 128 and second vacuum port 120 at a pressure ($P_2$). The second pressure ($P_2$) can be less than about 0.1 MPa, or from about 3 Pa to 0.1 MPa. In some embodiments, the magnitude of the second pressure ($P_2$) is independent from the magnitude of the first pressure ($P_1$). During the TCB process, the magnitude of the pressure $P_1$ is configured to retain the die 140 (e.g., a die stack) as the bondhead 102 moves the die 140 into position over the substrate 160 for bonding. In these embodiments, the magnitude of the pressure $P_1$ is high enough to account for uneven topography of surfaces of semiconductor devices, which can affect the ability of the bondhead 102 to create an airtight seal with the die 140.

In FIG. 1C, the tool 110 omits the second flow unit 132 of tool 100. In the tool 110, the first flow unit 130 is fluidly coupled to the first and second vacuum conduits 122 and 124 and is configured to withdraw both the first fluid from the first vacuum port 116 and the second fluid from the second vacuum port 120 either simultaneously or in sequence. In embodiments where the first flow unit 130 withdraws both the first and second fluids simultaneously, one or more valves may be included in one or both of the first and second vacuum conduits 122 and 124 to apply the first and second pressures $P_1$ and $P_2$. In FIG. 1C, a first valve 162 is positioned in the first vacuum conduit 122 and a second valve 164 is positioned in the second vacuum conduit 124. The first and second valves 162 and 164 are configured to provide a simultaneous balanced or differentiated pressure between the first and second vacuum ports 116 and 120. In embodiments where the first flow unit 130 withdraws the first and second fluids sequentially, the first and second valves 162 and 164 may cycle to alternate flow between the first and second vacuum ports 116 and 120. The cycling of the first and second valves 162 and 164 can be configured such that the first and second pressures $P_1$ and P2 are applied separately, simultaneously, or any combination thereof.

As previously described, the second flow unit 132 is configured to withdraw the second fluid from the second vacuum channel 128 and the second vacuum port 120 which are respectively peripherally outward from the first and second vacuum channels 112 and 114 and the first vacuum port 116. In such an arrangement, withdrawing the second fluid at least partially prevents vaporized bonding material from entering the first opening. For example, in one embodiment, a negative pressure is created peripheral to the first and second vacuum channels 112 and 114 that creates a path for the vaporized bonding material to be withdrawn before it reaches the first opening. In such an embodiment, at least a portion of vaporized bonding material is preferentially withdrawn through the second vacuum channel 128 and the second vacuum port 120 instead of through the first and second vacuum channels 112 and 114 and the first vacuum port 116. In some embodiments, the second conduit 124 can have one or more filter units 126 (e.g., a mesh screen) configured to capture the vaporized bonding material 152 and thereby prevent any captured vaporized bonding material from fouling the second conduit 124 and/or the second flow unit 132.

In certain embodiments, the second conduit 124 is replaceable in a relatively short amount of time and/or at a relatively low cost. The second conduit 124 may be a replaceable tube configured to retain the vaporized contaminants and be discarded at certain time intervals or detected levels of buildup of contaminants. The replaceable tubes can include one or more contaminant collection features, such as a coil or filter, to retain the vaporized contaminants. In this regard, the vacuum flow rate of the supplemental vacuum can be monitored using any suitable method for values lower than a control limit, which would indicate the need to replace the supplemental vacuum tubes. In some embodiments, a single supplemental vacuum tube is used to draw a vacuum; however, any number of supplemental vacuum tubes can be used to draw the vacuum and retain the vaporized contaminants, e.g., tubes positioned on each side of the bondhead and each corner of the bondhead.

The embodiment shown in FIG. 1A has first and second vacuum channels 112 and 114 that generally extend radially outward from the first vacuum port 116. For example, the first vacuum channels can extend toward each corner of the bondhead 102 and the second vacuum channels 114 generally extend from the first vacuum port 116 orthogonal to an edge of the bondhead 102. The first and second vacuum channels 112 and 114 are substantially mirrored across the horizontal midpoint of the bondhead 102. This configuration of the first and second vacuum channels 112 and 114 is expected to cover a sufficient surface area of the second side 108 of the bondhead 102 to ensure the air withdrawn through the first and second vacuum channels 112 and 114 provides enough suction force to hold the die 140 to the bondhead 102. For example, the first and second vacuum channels 112 and 114 can have larger lateral dimensions than that of the first vacuum port 116. This larger lateral dimension can cover a larger surface area of the die 140 to help better secure the die 140 to the bondhead 102 once a vacuum is drawn via the first flow unit 130. In other embodiments, the first and second vacuum channels 112 and 114 are omitted such that the first pressure $P_1$ is applied to the die 140 directly through the first vacuum port 116. The configuration of the first and second vacuum channels 112 and 114 shown in FIG. 1A is meant to represent a non-limiting example of possible bondhead designs that can be configured in accordance with the present technology. A person of ordinary skill in the art will appreciate that further bondhead designs may be included and configured in accordance with the present technology.

Configurations of the second vacuum port 120 and the second vacuum channel 128 can vary from the embodiment shown in FIG. 1A. As another example, the embodiment shown in FIG. 1A includes only a single port to apply a vacuum to the second fluid from the second vacuum channel 128. In other embodiments, additional ports may be provided to better ensure an even distribution of the vacuum throughout the second vacuum channel 128. For example, an additional second port (not shown) fluidly coupled to the second vacuum channel 128 and the second flow unit 132 may be included at an opposite end of the bondhead 102. As yet another example, instead of the second vacuum channel 128 completely surrounding the first and second vacuum channels 112 and 114, the second vacuum channel 128 can surround only a portion of first and second vacuum channels 112 and 114. For example, the second vacuum channel 128 may surround only the upper and lower portions of the first and second vacuum channels 112 and 114, or the second vacuum channel 128 may be positioned in other areas where vaporized bonding material is more likely to enter the first and second vacuum channels 112 and 114.

Figure 2A:
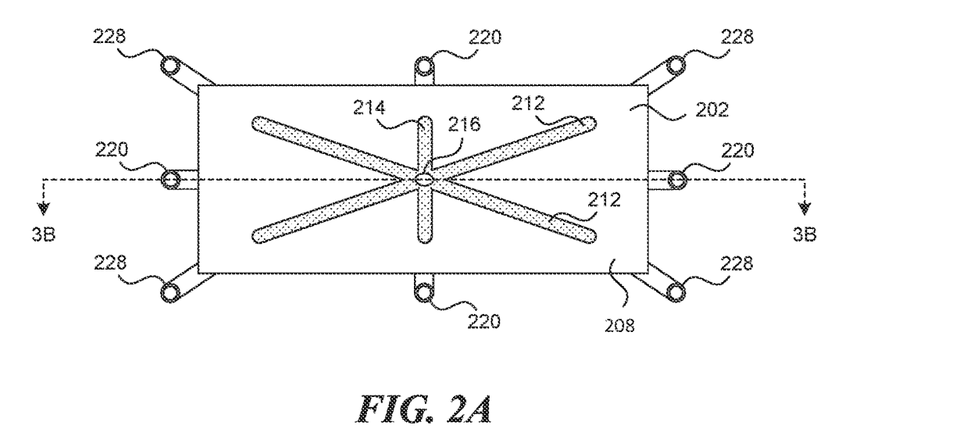
FIG. 2A is a bottom plan view of a bondhead configured in accordance with selected embodiments of the present technology.
Figure 2B:
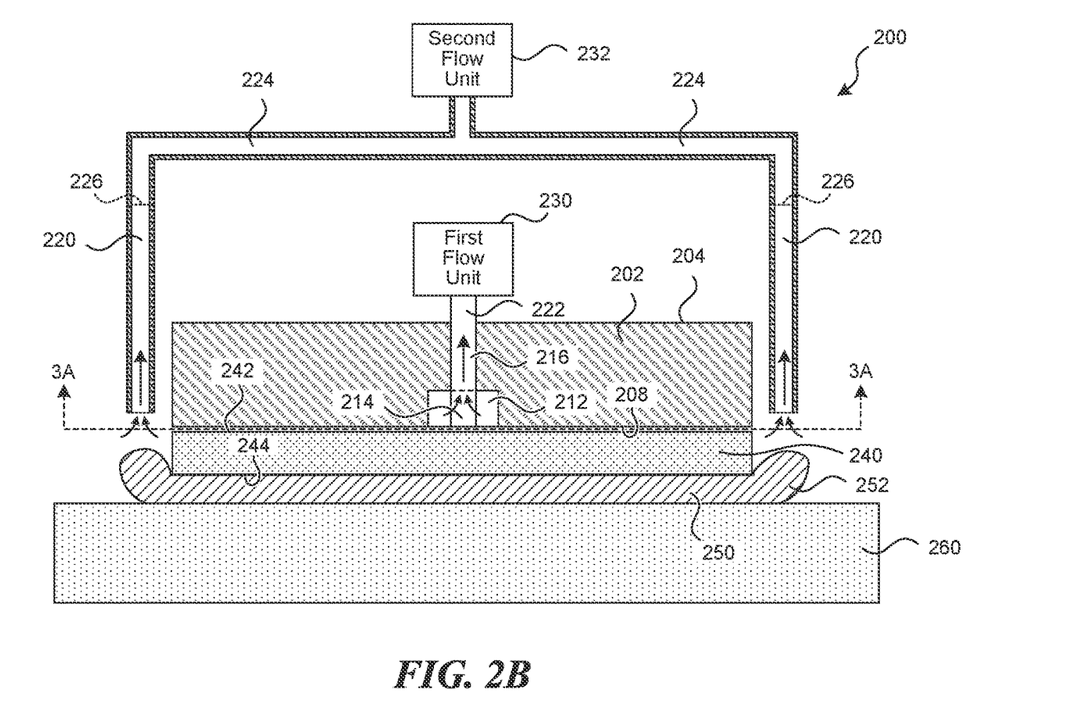
FIG. 2B is a cross-sectional side view of a semiconductor processing tool including the bondhead shown in FIG. 2A.

FIGS. 2A and 2B show an embodiment of a semiconductor processing tool 200 ("tool 200") of the present technology. Certain features of the tool 200 shown in FIGS. 2A and 2B are similar to features of the tool 100 described above, and as such the features of the tool 200 are denoted in the 200-series with like numbers in the 200-series corresponding to similar features of the tool 100 denoted in the 100-series unless otherwise stated.

Referring first to FIG. 2B, the tool 200 includes a bondhead 202 and a first flow unit 230 fluidly coupled to the bondhead 202 via a first vacuum conduit 222. During TCB processing, the bondhead 202 can be operably positioned over a semiconductor die 240 ("die 240") such that at least a portion of a front side 242 of the die 240 contacts a second side 208 of the bondhead 202 while a back side 244 of the die 240 is bonded to a substrate 260 with a bonding material 252. The bondhead 202 includes a first vacuum port 210 and a plurality of first and second vacuum channels 212 and 214 fluidly coupled to the first vacuum port 210. The first and second vacuum channels 212 and 214 can be troughs or trenches arranged in a pattern across the second side 208 in a similar manner to the bondhead 102. The plurality of first and second vacuum channels 212 and 214 are configured to apply the vacuum across the second side 208 and interface the front side 242 or back side 244 to retain the die 240 during the TCB process.

The bondhead 202 includes similar features to the bondhead 102 described above, except the recessed ledge 106, the second vacuum port 120, and the second vacuum channel 128 shown in FIGS. 1A-1C are omitted and instead replaced by first and second supplemental conduits 220 and 228 (shown together in FIG. 2A). The first and second conduits 220 and 228 are separate from the bondhead 202 and disposed around a perimeter thereof. Referring to FIG. 2A, the first and second supplemental conduits 220 and 228 can be arranged in a manifold at locations around the bondhead 202, and they are configured to withdraw fluid (e.g., air and vapor) from areas around the bondhead 202 and the die 240 during TCB processing. In the illustrated embodiment, the first supplemental conduits 220 are positioned near centerpoints along the edges of the bondhead 202 and the second supplemental conduits 228 are positioned near each corner of the bondhead 202. In other embodiments, any suitable number of first and second supplemental conduits 220 and 228 are used in accordance with the present technology, including fewer or more than the illustrated embodiment having four of each of the first and second supplemental conduits 220 and 228. In further embodiments, the tool 200 can completely omit either the first or second supplemental conduits 220 or 228, or the conduits can be placed in one or more positions according to concentrations of the vapor offgassing during the TCB process.

The first and second supplemental conduits 220 and 228 are fluidly coupled to a second flow unit 232 through a second conduit 224, which can be a single plenum or individual conduits. Such individual conduits can be arranged with the opening of the conduits positioned around a peripheral portion of the die 240. As with the recessed ledge 106 of the bondhead 102, in some embodiments, the first and second supplemental conduits 220 and 228 have ends with openings that are positioned above the second side 208 of the bondhead 202 to provide clearance from neighboring semiconductor devices. The operation of the tool 200 in a TCB process is substantially similar to the tool 100, described herein, and such operation will not be described in detail with regard to tool 200.

The semiconductor processing tool 100 shown in FIGS. 1A and 1B, the tool 110 shown in FIG. 1C, and the tool 200 shown in FIGS. 2A and 2B, can be operated by activating the first flow unit 130 to reduce the pressure in the first opening and thereby bring at least a portion of the die 140 into contact with at least a portion of the second side 108 of the bondhead 102. Once the die 140 is brought into contact with the bondhead 102, at least a partial seal is formed at an interface between the die 140 and bondhead 102. Once established, the seal may be maintained even after the first flow unit 130 (i.e., the vacuum unit) is deactivated. As such, in some embodiments, the first flow unit 130 does not need to be operable during the entire time the die 140 is being bonded to the substrate 160. Deactivating the first flow unit 130 during the bonding process decreases the driving force that draws vaporized bonding material through the first opening and into the first vacuum conduit 122 and/or the first flow unit 130.

During the TCB process, the second flow unit 132 is activated to withdraw the second fluid from the second opening (or the first and second valves 162 and 164 in the tool 110). Because the second opening is peripheral to and is around at least a portion of the first opening in the illustrated embodiment, the second fluid draws in surrounding fluid (e.g., air and contaminants from the outgassing) from outer portions of the die 140 compared to the first fluid being withdrawn through the first opening. As such, in operation, the second fluid provides a less resistive path around the first opening that draws in the vaporized material from around the bondhead 102 and the front side 142 of the die 140.

As the bonding material 152 spreads to the periphery of the bottom side 144 of the die 140, the first flow unit 130 and the second flow unit 132 may remain operational. As such, the second flow unit 132 may continue to withdraw the second fluid from outer portions of the die 140 and provide a vacuum around the die 140 that draws in vaporized bonding material 152 and prevents such material from traveling between the second side 108 of the bondhead 102 and the front side 142 of the die 140 and into the first vacuum port 116. In some embodiments, fillets 152 of bonding material 152 may form at outer portions of the die 140; however, the thickness of the die 140 can be configured to prevent contamination of the bondhead 102 from the fillets 152.

Figure 3:
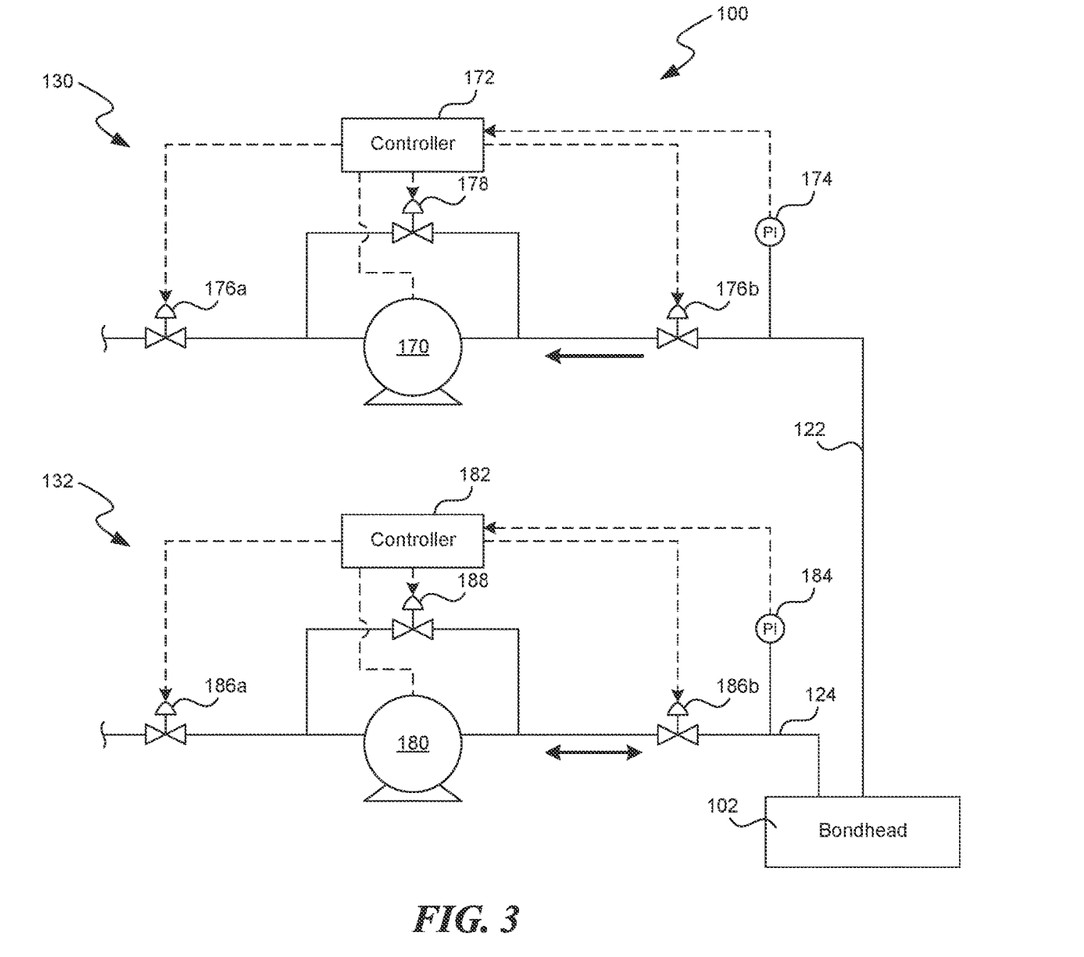
FIG. 3 is a schematic illustration of a flow unit system configured in accordance with selected embodiments of the present technology.

FIG. 3 shows a schematic illustration of a flow system 100 for withdrawing fluids from the bondhead 102. The flow system 100 includes a first flow unit 130 configured to withdraw fluid from the bondhead 102, and a second flow unit 132 configured to withdraw fluid from the bondhead 102. The first flow unit 130 includes a vacuum unit 170, a first recirculation valve 178, a first discharge valve 176a, a first inlet valve 176b, and a first pressure sensor 174. In some embodiments, the first flow unit 130 is coupled to the bondhead 102 via the first vacuum conduit 122. The vacuum unit 170, the valves 178, 176a, and 176b, and the pressure sensor 174 can each be operably connected to a controller 172 for controlling flow through the vacuum unit 170 to maintain a particular pressure (e.g., $P_1$). For example, the controller 172 can maintain a particular pressure by opening and/or closing valves 178, 176a, and 176b according to the present value of the first pressure sensor 174.

The second flow unit 132 includes a vacuum unit 180, a second recirculation valve 188, a second inlet valve 186a, a second discharge valve 186b, and a second pressure sensor 184. The second flow unit 132 is coupled to the bondhead 102 via the second conduit 124. The vacuum unit 180, the valves 188, 186a, and 186b, and the second pressure sensor 184 can each be operably connected to a controller 182 for controlling flow through the vacuum unit 180 to maintain a particular pressure (e.g., $P_2$). In some embodiments, the controllers 172 and 182 can be connected to a master controller (not shown) to provide better control pressure of the fluids being withdrawn from the bondhead 102. A person of ordinary skill in the art will recognize that other flow units and/or valve arrangements may be used to perform a similar function as described herein.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. For example, while the specification focuses on thermocompression bonding with NCF, NCP, and/or WLUF, the present technology can also be applied to other processes and/or applications, such as fluxes used for microbump formation and flip-chips. In some cases, well known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The present disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A method for inhibiting vaporized bonding material from entering a vacuum system, the method comprising:
   withdrawing air, via a first flow unit, from a first port of a bondhead having a first side and a second side spaced at a distance from the first side and defining a thickness of the bondhead, wherein the first port is fluidly coupled to a first channel of the bondhead extending in a lateral direction from the port along the second side toward a perimeter of the bondhead, the first channel forming an elongate opening in the second side of the bondhead; and
   withdrawing air, via a second flow unit, from a second port, wherein the second port is fluidly coupled to a second conduit positioned laterally outward from the first channel such that contaminants flow into the second conduit,
   wherein the second conduit is a vacuum manifold separate from and disposed around the bondhead, the vacuum manifold having a portion extending along and spaced apart from a side of the bondhead and positioned laterally outward from the perimeter of the bondhead, the second conduit having a second vacuum opening positioned laterally outward from the bondhead.

2. The method of claim 1, wherein the first flow unit includes a vacuum unit that creates a first pressure in the first channel, and wherein the second flow unit includes a vacuum unit that creates a second pressure in the second conduit.

3. The method of claim 2, wherein an absolute value of the first pressure is greater than an absolute value of the second pressure.

4. The method of claim 1, wherein the bondhead is positioned over a die and a bonding material, and wherein withdrawing air from the second conduit at least partially prevents vaporized bonding material from entering the first channel.

5. The method of claim 1, further comprising:
   positioning the bondhead over a die at least partially surrounded by a bonding material,
   wherein withdrawing air via the second flow unit includes preventing vapor from the bonding material from flowing through the first port.

6. The method of claim 1, wherein:
   the first port extends from the first side of the bondhead to an intermediate depth of the bondhead, and
   the first channel extends from the second side of the bondhead to the intermediate depth of the bondhead.

* * * * *